United States Patent
Mitsui et al.

(10) Patent No.: US 12,027,677 B2
(45) Date of Patent: Jul. 2, 2024

(54) METHOD FOR MANUFACTURING NON-AQUEOUS-ELECTROLYTE SECONDARY CELL, AND VOLTAGE DETECTION METHOD

(71) Applicant: SANYO Electric Co., Ltd., Daito (JP)

(72) Inventors: Shohei Mitsui, Osaka (JP); Natsuhiko Mukai, Osaka (JP); Junichi Sugaya, Osaka (JP)

(73) Assignee: PANASONIC ENERGY CO., LTD., Osaka (JP)

( * ) Notice: Subject to any disclaimer, the term of this patent is extended or adjusted under 35 U.S.C. 154(b) by 333 days.

(21) Appl. No.: 17/417,224

(22) PCT Filed: Dec. 17, 2019

(86) PCT No.: PCT/JP2019/049496
§ 371 (c)(1),
(2) Date: Jun. 22, 2021

(87) PCT Pub. No.: WO2020/137717
PCT Pub. Date: Jul. 2, 2020

(65) Prior Publication Data
US 2022/0093982 A1   Mar. 24, 2022

(30) Foreign Application Priority Data
Dec. 28, 2018 (JP) ................. 2018-246743

(51) Int. Cl.
*H01M 10/44* (2006.01)
*G01R 31/378* (2019.01)
(Continued)

(52) U.S. Cl.
CPC ........ *H01M 10/446* (2013.01); *G01R 31/378* (2019.01); *G01R 31/3865* (2019.01);
(Continued)

(58) Field of Classification Search
CPC .. H01M 4/525; G01R 31/378; G01R 31/3865
See application file for complete search history.

(56) References Cited

U.S. PATENT DOCUMENTS

2013/0260227 A1* 10/2013 Ohnuma ........... H01M 10/0564
429/188
2015/0280208 A1   10/2015 Kimura et al.
(Continued)

FOREIGN PATENT DOCUMENTS

CN   103367808 A   10/2013
CN   107078340 A   8/2017
(Continued)

OTHER PUBLICATIONS

Extended (Supplementary) European Search Report dated Jan. 27, 2022, issued in counterpart EP application No. 19903545.2. (8 pages).
(Continued)

*Primary Examiner* — Noam Reisner
(74) *Attorney, Agent, or Firm* — WHDA, LLP

(57) ABSTRACT

The purpose of the present invention is to shorten the manufacturing time in a method for manufacturing a non-aqueous-electrolyte secondary cell. In the method for manufacturing a non-aqueous-electrolyte secondary cell according to one embodiment of the present invention, during initial charging/discharging of a non-aqueous-electrolyte secondary cell comprising a negative electrode that includes a negative-electrode active material, a positive electrode that includes a Li—Ni composite oxide represented by the general formula $Li_aNi_xM_{(1-x)}O_2$ (where $0<a\leq 1.2$, $0.6\leq x<1$, and M is at least one element selected from Co, Mn, and Al) as a positive-electrode active material, and a non-aqueous
(Continued)

electrolyte, charging is performed so that the positive electrode potential based on lithium is 4.1-4.25 V in an open circuit state after charging.

4 Claims, 2 Drawing Sheets

(51) Int. Cl.
*G01R 31/385* (2019.01)
*H01M 4/02* (2006.01)
*H01M 4/133* (2010.01)
*H01M 4/134* (2010.01)
*H01M 4/505* (2010.01)
*H01M 4/525* (2010.01)
*H01M 4/587* (2010.01)
*H01M 10/0525* (2010.01)

(52) U.S. Cl.
CPC ........... *H01M 4/133* (2013.01); *H01M 4/134* (2013.01); *H01M 4/505* (2013.01); *H01M 4/525* (2013.01); *H01M 4/587* (2013.01); *H01M 10/0525* (2013.01); *H01M 2004/028* (2013.01)

(56) References Cited

U.S. PATENT DOCUMENTS

2017/0317380 A1* 11/2017 Takijiri .................. H01M 4/48
2018/0026298 A1 1/2018 Hasegawa et al.

FOREIGN PATENT DOCUMENTS

| JP | H09-232002 A | 9/1997 |
| JP | 2014-17209 A | 1/2014 |
| JP | 2017-106867 A | 6/2017 |
| JP | 2018-081742 A | 5/2018 |
| WO | 2016/151979 A1 | 9/2016 |

OTHER PUBLICATIONS

International Search Report dated Mar. 3, 2020, issued in counterpart application No. PCT/JP2019/049496 (2 pages).
English Translation of Chinese Office Action dated Jan. 27, 2024 for the counterpart Chinese Patent Application No. 201980086471.X.

* cited by examiner

METHOD FOR MANUFACTURING NON-AQUEOUS-ELECTROLYTE SECONDARY CELL, AND VOLTAGE DETECTION METHOD

TECHNICAL FIELD

The present disclosure relates to a method for manufacturing a non-aqueous electrolyte secondary battery and a voltage inspection method.

BACKGROUND ART

In manufacturing non-aqueous electrolyte secondary batteries, initial charging and discharging may be carried out after assembly and before shipping. After the initial charging and discharging, the voltages of the secondary batteries are inspected, and only secondary batteries for which the voltage changes thereof have been judged to be good are shipped. Consequently, voltage failure in products after shipping can be prevented. PATENT LITERATURE 1 discloses that in initial charging in initial charging and discharging, the charging voltage is set to: (open circuit voltage (OCV) in fully charged state −2000 mV) or more, and (open circuit voltage in fully charged state −25 mV) or less.

CITATION LIST

Patent Literature

PATENT LITERATURE1: Japanese Unexamined Patent Application Publication No. 2014-17209

SUMMARY

Technical Problem

It has been desired that the charging time in initial charging and discharging is shortened to shorten the time required to manufacture secondary batteries. However, when charge capacity is reduced in order to shorten charging time, the amount of expansion of electrode assemblies in secondary batteries decreases in charging, which may result in insufficient activation of secondary batteries in initial charging and discharging.

In addition, when voltage inspection is carried out after initial charging and discharging of secondary batteries, the secondary batteries are fully charged once so as to reliably exclude defective articles. Therefore, shortening of time required for voltage inspection and reliable exclusion of defective articles are difficult to achieve at the same time.

An advantage of the present disclosure is to shorten manufacturing time in a method for manufacturing a non-aqueous electrolyte secondary battery. In addition, an advantage of the present disclosure is to shorten time required for voltage inspection after assembly in a method for voltage inspection for a non-aqueous electrolyte secondary battery and to reliably exclude defective articles.

Solution to Problem

A method for manufacturing a non-aqueous electrolyte secondary battery according to the present disclosure is a method for manufacturing a non-aqueous electrolyte secondary battery, the method comprising: carrying out charging so that a positive electrode potential in terms of a lithium reference in an open circuit state after charging becomes 4.1 to 4.25 V in initial charging and discharging for a non-aqueous electrolyte secondary battery; the non-aqueous electrolyte secondary battery comprising: a negative electrode including a negative electrode active material; a positive electrode including, as a positive electrode active material, a Li—Ni-based composite oxide represented by a general formula $Li_aNi_xM_{(1-x)}O_2$ (provided that $0<a\leq1.2$, $0.6\leq x<1$, and M is at least one element selected from the group consisting of Co, Mn, and Al); and a non-aqueous electrolyte.

A method for voltage inspection for a non-aqueous electrolyte secondary battery according to the present disclosure is a method for voltage inspection for a non-aqueous electrolyte secondary battery, the method comprising: carrying out charging so that a positive electrode potential in terms of a lithium reference in an open circuit state after charging becomes 4.1 to 4.25 V for the non-aqueous electrolyte secondary battery and subsequently measuring a voltage of the non-aqueous electrolyte secondary battery; the non-aqueous electrolyte secondary battery comprising: a negative electrode including a negative electrode active material; a positive electrode including, as a positive electrode active material, a Li—Ni-based composite oxide represented by a general formula $Li_aNi_xM_{(1-x)}O_2$ (provided that $0<a\leq1.2$, $0.6\leq x<1$, and M is at least one element selected from the group consisting of Co, Mn, and Al); and a non-aqueous electrolyte.

Advantageous Effects of Invention

According to the method for manufacturing a non-aqueous electrolyte secondary battery according to the present disclosure, manufacturing time can be shortened. In addition, according to the method for voltage inspection for a non-aqueous electrolyte secondary battery according to the present disclosure, time required for voltage inspection can be shortened, and defective articles can be reliably excluded.

DESCRIPTION OF EMBODIMENTS

Figure 1:
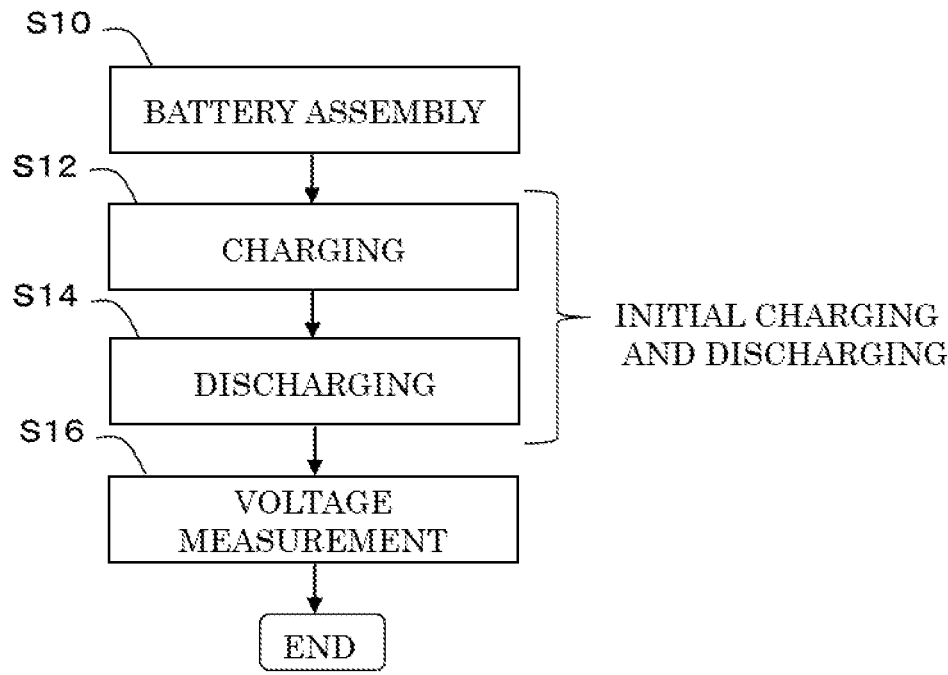
FIG. 1 is a flowchart showing a method for manufacturing a non-aqueous electrolyte secondary battery and a method for voltage inspection method according to one example of an embodiment.

The present inventors have found that expansion of an electrode assembly is maximized at a predetermined positive electrode potential before full charging at the time of charging a non-aqueous electrolyte secondary battery including the above-described Li—Ni-based composite oxide as a positive electrode active material and have solved the above problems on the basis of this finding.

The "initial charging and discharging" in the present disclosure is charging and discharging accompanied by initial discharging after assembly of a non-aqueous electrolyte secondary battery, and partial charging carried out for, for example, degassing inside the secondary battery and aging of the battery after the partial charging may be carried out before the charging and discharging. That is, charging in the initial charging and discharging may be started from a state where the secondary battery has a predetermined state of charge (SOC) due to partial charging before the initial charging and discharging.

The "positive electrode potential in terms of a lithium reference in an open circuit state after charging" in the present disclosure is calculated by measuring the open circuit voltage (OCV) of the secondary battery 30 minutes after the end of charging, for example.

Hereinafter, an embodiment according to the present disclosure will be described in detail with reference to the accompanying drawings. In the following description, specific materials, values, and the like are examples given to facilitate understanding of the present disclosure and can be appropriately changed according to specifications of secondary batteries to be produced by the embodiment. In the following description, a cylindrical battery in which a winding-type electrode assembly is housed in a case having a cylindrical shape will be described. However, the battery is not limited to a cylindrical battery and may have a square shape. In addition, the electrode assembly may be a laminated type electrode assembly in which multiple positive electrodes and multiple negative electrodes are alternately laminated with a separator interposed therebetween.

[Non-Aqueous Electrolyte Secondary Battery]

The non-aqueous electrolyte secondary battery comprises a winding-type electrode assembly, a non-aqueous electrolyte, and a case housing the electrode assembly and the non-aqueous electrolyte. Hereinafter, the non-aqueous electrolyte secondary battery is referred to as the secondary battery. The electrode assembly has a positive electrode, a negative electrode, and a separator, and the positive electrode and the negative electrode are spirally wound with the separator interposed therebetween. The non-aqueous electrolyte includes a non-aqueous solvent and an electrolyte salt dissolving in the non-aqueous solvent.

The positive electrode has a positive electrode current collector and a positive electrode active material layer formed on the positive electrode current collector. For example, the positive electrode active material layer is formed on both sides of the positive electrode current collector. Foil of a metal such as aluminum, a film with said metal disposed on the surface layer of the film, or the like is used as the positive electrode current collector, for example. A preferred positive electrode current collector is metal foil containing aluminum or an aluminum alloy as a main component. A thickness of the positive electrode current collector is 10 µm to 30 µm, for example. The positive electrode active material layer preferably includes a positive electrode active material, a conductive agent, and a binder. The positive electrode is prepared by applying a positive electrode mixture slurry including a positive electrode active material, a conductive agent, a binder, and a solvent such as N-methyl-2-pyrrolidone (NMP) on both sides of the positive electrode current collector followed by drying and rolling, for example.

As the positive electrode active material, a Li—Ni-based composite oxide represented by a general formula $Li_aNi_xM_{(1-x)}O_2$ (in the formula, $0<a\leq1.2$, $0.6\leq x<1$, and M is at least one element selected from the group consisting of Co, Mn, and Al) is used. A Li—Ni-based composite oxide represented by a general formula $Li_aNi_xCo_yAl_zO_2$ (in the formula, $0<a\leq1.2$, $0.8\leq x<1$, $0<y<0.1$, $0<z<0.1$, and $x+y+z=1$) is preferably used. The symbol "a" representing an amount of Li in the above general formula is set so that $0<a\leq1.2$ because the amount of Li changes through charging and discharging, but in a case of a positive electrode active material immediately after preparation, "a" preferably satisfies $0.95\leq a\leq1.2$.

Examples of the conductive agent include carbon materials such as carbon black (CB), acetylene black (AB), ketjenblack, and graphite. Examples of the binder include fluororesins such as polytetrafluoroethylene (PTFE) and polyvinylidene difluoride (PVdF), polyacrylonitrile (PAN), polyimide (PI), acrylic resins, polyolefin-based resins, and the like. In addition, carboxymethyl cellulose (CMC) or a salt thereof, polyethylene oxide (PEO), and the like may be used in combination with these resins. One of them may be used alone, or two or more of them may be used in combination.

The negative electrode has a negative electrode current collector and a negative electrode active material layer formed on the negative electrode current collector. For example, the negative electrode active material layer is formed on both sides of the negative electrode current collector. The negative electrode current collector is made of foil of a metal such as copper, for example. A thickness of the negative electrode current collector is 5 µm to 30 µm, for example. The negative electrode active material layer preferably includes a negative electrode active material and a binder. The negative electrode is prepared by applying a negative electrode mixture slurry including a negative electrode active material, a binder, and water or the like on both sides of the negative electrode current collector followed by drying and rolling, for example.

The negative electrode active material is not particularly limited as long as the material can reversibly intercalate and deintercalate lithium ions, and carbon materials such as natural graphite and artificial graphite, a metal capable of being alloyed with lithium such as Si and Sn, an alloy including them, a composite oxide, and the like can be used as the negative electrode active material, for example. The negative electrode preferably includes, as the negative electrode active material, a mixture of graphite and 0% to 10% by mass of a material including Si based on the total mass of the negative electrode active material. The same resin as in the case of the positive electrode is used for the binder included in the negative electrode active material layer, for example. In a case where the negative electrode mixture slurry is prepared with an aqueous solvent, styrene-butadiene rubber (SBR), CMC or a salt thereof, polyacrylic acid or a salt thereof, polyvinyl alcohol, and the like can be used. One of them may be used alone, or two or more of them may be used in combination.

A porous sheet having ion permeability and insulation properties is used for the separator. Specific examples of the porous sheet include a microporous thin film, woven fabric, nonwoven fabric, and the like. Olefin resins such as polyethylene and polypropylene are preferable as materials for the separator. A thickness of the separator is 10 µm to 50 µm, for example.

[Method for Manufacturing Secondary Battery and Method for Voltage Inspection]

Next, a method for manufacturing a secondary battery and a method for voltage inspection will be described. FIG. 1 is a flowchart showing a method for manufacturing a non-aqueous electrolyte secondary battery and a method for voltage inspection according to one example of the embodiment. The method for manufacturing the secondary battery includes a battery assembling step (S10) and an initial charging and discharging step (S12, S14). The method for voltage inspection for a secondary battery has the initial charging and discharging step (S12, S14) and a voltage measuring step for inspecting voltage of the secondary battery (S16).

In step S10, a secondary battery is assembled. For example, in a case of a cylindrical battery, the battery is assembled by inserting an electrode assembly in which a positive electrode and a negative electrode facing each other are wound with a separator interposed therebetween into a bottomed cylindrical case body, then injecting an electrolyte solution, and sealing an opening of the case body with a sealing assembly.

Thereafter, in step S12, the battery is connected to a charging circuit, and charging in the initial charging and discharging step is carried out. At that time, charging is carried out so that the positive electrode potential in terms of a lithium reference in an open circuit state after charging becomes 4.1 to 4.25 V. The positive electrode potential of 4.1 to 4.25 V in terms of a lithium reference corresponds to a state of charge (SOC) of 75% to 95% in the secondary battery. The secondary battery can be charged so that the state of charge thereof becomes 75% to 95% in step S12 thereby. More preferably, charging is carried out so that the positive electrode potential in terms of a lithium reference in an open circuit state after charging becomes 4.208 to 4.218 V in step S12. The positive electrode potential of 4.208 to 4.218 V in terms of a lithium reference corresponds to a state of charge (SOC) of 90% to 92% in the secondary battery. Incidentally, the positive electrode potential in terms of a lithium reference in an open circuit state after charging can be controlled on the basis of the voltage of the secondary battery.

In step S12, only constant current charging (CC charging) may be carried out, or constant current constant voltage charging (CCCV charging) may be conducted. In step S12, multistage CC charging in which the current value for CC charging is switched in a stepwise manner may be carried out.

In step S12, as described later, the electrode assembly of the secondary battery can be expanded at a maximum level. The secondary battery after assembly can be sufficiently activated thereby. In addition, since the secondary battery is not charged to reach the positive electrode potential, in terms of a lithium reference, corresponding to full charging, the time required for step S12 can be shortened. Consequently, manufacturing time for the secondary battery can be shortened.

After step S12, the secondary battery is discharged in step S14. A discharge termination voltage is preferably set to 2.5 V or more and 3.5 V or less in step S14. After step S14, voltage measurement in step S16 is carried out. The voltage measurement is preferably carried out on the secondary battery having been left for a predetermined time after step S14, for example. A state of the secondary battery can be inspected on the basis of the measured value. In addition, a voltage of the secondary battery immediately after step S14 can also be measured. Since the electrode assembly sufficiently expands through step S12, defective articles showing a great voltage drop in the voltage inspection step including step S12 to step S16 can be reliably excluded. Charging time in step S12 is shortened compared with that in a case where the secondary battery is fully charged. Accordingly, the voltage inspection step described above enables both shortening of time required and reliable exclusion of defective articles. Incidentally, aging of the secondary battery or the like may be carried out between step S14 and step S16.

Figure 2:
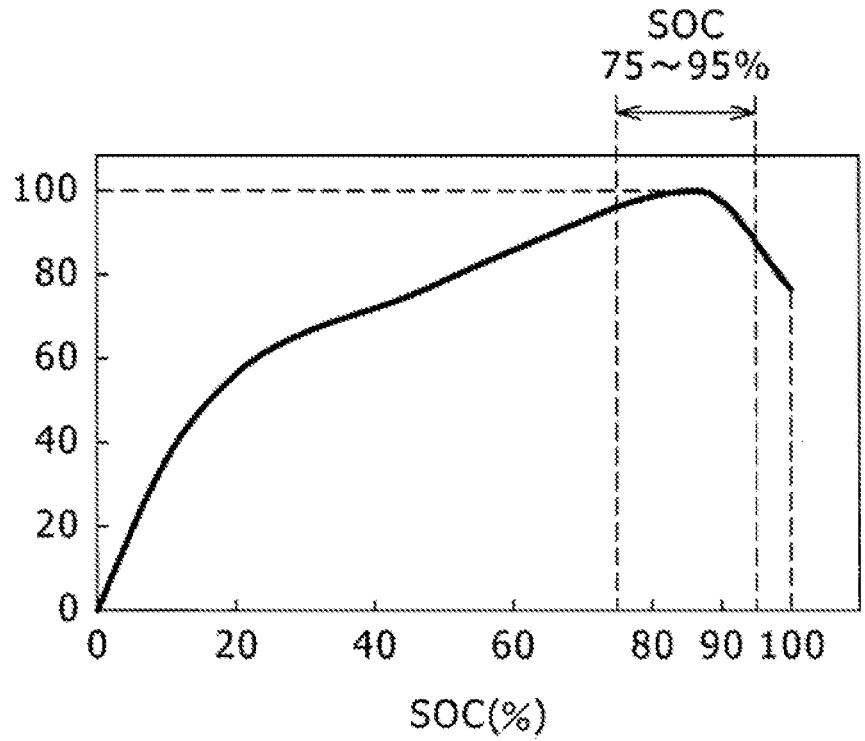
FIG. 2 is a graph showing the relationship between a volume change rate of active materials and a state of charge (SOC) in an electrode assembly of a non-aqueous electrolyte secondary battery.

According to the above-described method for manufacturing the secondary battery, manufacturing time can be shortened. In addition, according to the above-described method for voltage inspection for a secondary battery, shortening of time required for the voltage inspection step and reliable exclusion of defective articles are achieved at the same time. Findings based on which the manufacturing method and the method for voltage inspection have been found will be described. FIG. 2 is a graph showing the relationship between a volume change rate of active materials and a state of charge (SOC) in an electrode assembly of a secondary battery. The present inventors have calculated, by an X-ray diffraction method using an X-ray diffraction device (XRD), changes in lattice constants of the positive electrode and negative electrode associated with an SOC change for a secondary battery having a positive electrode active material including a Li—Ni-based composite oxide represented by the general formula $Li_aNi_xM_{(1-x)}O_2$. Then, the present inventors have calculated a volume change rate of the positive and negative electrode active materials (a sum of the volumes of the positive and negative electrode active materials) of the electrode assembly from estimation of changes in volumes of the positive electrode and negative electrode. In FIG. 2, the horizontal axis shows the SOC, and the vertical axis shows the volume change rate (expansion coefficient) of the positive and negative electrode active materials when the volume of the positive and negative electrode active materials with a SOC of 0% is taken as a reference, and the amount of the volume expansion of the positive and negative electrode active materials at the time of maximum expansion is taken as 100%.

The present inventors have found that the volume change rate of the positive and negative electrode active materials approximately becomes maximum when the state of charge (SOC) ranges from 75% to 95% as shown in FIG. 2. The reason therefor is as follows: when the state of charge of the secondary battery increases from 0%, the volume of the negative electrode active material substantially linearly increases due to intercalation of Li; meanwhile, the volume of the positive electrode active material gradually decreases due to deintercalation of Li to the middle of increase of the state of charge but drastically decreases at a certain state of charge (SOC) or later. The present inventors have found the above-described manufacturing method and method for voltage inspection on the basis of these findings.

EXAMPLES

Next, in order to confirm that charging time can be shortened when a secondary battery is charged by the manufacturing method of the embodiment, charting time was measured in each of Examples 1 to 3 and Comparative Example 1 under respective charging conditions. In Examples 1 to 3 and Comparative Example 1, secondary batteries having the same configuration were used, and the charging method in initial charging and discharging was changed.

Example 1

A cylindrical non-aqueous electrolyte secondary battery including a winding-type electrode assembly was used as the secondary battery. A lithium nickel cobalt aluminum composite oxide represented by $LiNi_{0.88}Co_{0.075}Al_{0.045}O_2$ was used as the positive electrode active material for the positive electrode of the secondary battery. A mixture of Si oxide and graphite was used as the negative electrode active material for the negative electrode.

A non-aqueous electrolyte solution was used for the non-aqueous electrolyte.

As shown in Table 1, only constant current charging (CC charging) was carried out at 0.4 C in an environment of 25° C. in initial charging after assembly in Example 1. At this time, 1C=4000 mA. The charging was carried out so that the state of charge (SOC) of the secondary battery became 90%. The open circuit voltage of the secondary battery after charging was 4.108 V, and the positive electrode potential at that time was 4.208 V in terms of a lithium reference. Measurement results of Example 1 are shown in Table 1 together with measurement results of Examples 2 and 3 and Comparative Example 1 described later.

TABLE 1

| | Charging method (with or without multistage CC) | Cutoff voltage (V) | Cutoff current | Positive electrode potential in terms of lithium reference after charging (V) | SOC after charging (%) | Charging time (min) |
|---|---|---|---|---|---|---|
| Comparative Example 1 | CCCV (Without multistage) | 4.2 (Constant 0.4 C) | 0.02 C | 4.284 | 100 | 134 |
| Example 1 | CC (Without multistage) | 4.2 (Constant 0.4 C) | — | 4.208 | 90 | 74 |
| Example 2 | CCCV (With multistage) | 4.164 | 0.2 C | 4.206 | 89 | 65 |
| Example 3 | CC (With multistage) | 4.2 | — | 4.208 | 90 | 64 |

Example 2

In Example 2, constant current constant voltage charging (CCCV charging) was carried out in initial charging after assembly. In the CC charging, multistage CC charging in which the current value is decreased in a stepwise manner was carried out. The cut voltage (termination voltage) in the multistage CC charging was set to 4.164 V. Thereafter, CV charging in which cut current (termination current) was set to 0.2 C was carried out. The open circuit voltage of the secondary battery after charging was 4.106 V, and the positive electrode potential at that time was 4.206 V in terms of a lithium reference. The SOC of the secondary battery was 89%.

Example 3

In Example 3, only multistage CC charging similar to that in Example 2 was carried out in initial charging after assembly. The cut voltage (termination voltage) in the multistage CC charging was set to 4.2 V. The open circuit voltage of the secondary battery after charging was 4.108 V, and the positive electrode potential at that time was 4.208 V in terms of a lithium reference. The SOC of the secondary battery was 90%.

Comparative Example 1

In Comparative Example 1, constant current constant voltage charging (CCCV charging) was carried out in initial charging after assembly. Only CC charging at 0.4 C different from multistage CC charging was carried out in CC charging. The cut voltage (termination voltage) in the CC charging was set to 4.2 V. Thereafter, CV charging in which cut current was set to 0.02 C was carried out. The open circuit voltage of the secondary battery after charging was 4.184, and the positive electrode potential at that time was 4.284 V in terms of a lithium reference. The SOC of the secondary battery was 100%.

Figure 3:
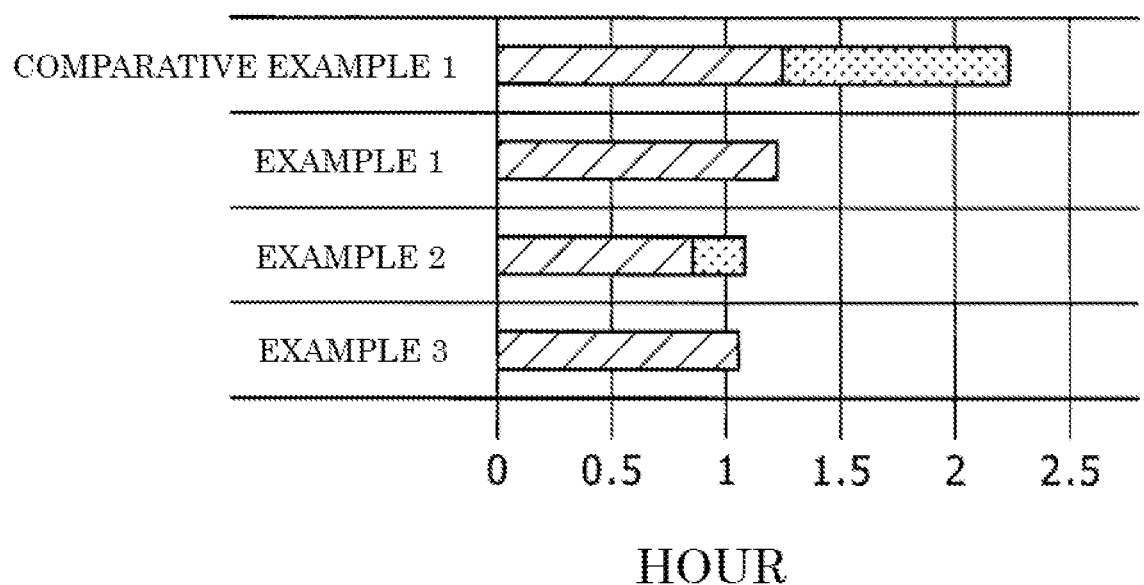
FIG. 3 is a diagram showing measurement results of charging time of non-aqueous electrolyte secondary batteries of Examples 1 to 3 and Comparative Example 1.

FIG. 3 shows measurement results of charging time in Examples 1 to 3 and Comparative Example 1 by a graph. In FIG. 3, shaded parts represent CC charging, and dotted parts represent CV charging. From the results shown in Table 1 and FIG. 3, it has been found that charging time is significantly shortened in Examples 1 to 3 compared with Comparative Example 1. In particular, as in Examples 2 and 3, it has been found that when multistage CC charging is carried out, charging can be carried out in charging time half the length of charging time in the charging method in Comparative Example 1 or shorter, and charging time can be further shortened.

The invention claimed is:

1. A method for manufacturing a non-aqueous electrolyte secondary battery, the method comprising:
   carrying out, in initial charging and discharging for the non-aqueous electrolyte secondary battery, charging so that a positive electrode potential in terms of a lithium reference in an open circuit state after charging becomes 4.1 to 4.25 V, the state of charge of the battery is between 75 and 95% and an amount of volume expansion of a positive electrode active material and a negative electrode active material is 100%;
   the non-aqueous electrolyte secondary battery comprising:
   a negative electrode including the negative electrode active material;
   a positive electrode including, as the positive electrode active material, a Li—Ni-based composite oxide represented by a general formula $Li_aNi_xM_{(1-x)}O_2$, wherein $0 < a \leq 1.2$, $0.6 \leq x < 1$, and M is at least one element selected from the group consisting of Co, Mn, and Al; and
   a non-aqueous electrolyte.

2. The method for manufacturing a non-aqueous electrolyte secondary battery according to claim 1, wherein
   the negative electrode active material includes graphite and a silicon compound, and
   a content of the silicon compound is more than 0% by mass and 20% by mass or less based on a total mass of the negative electrode active material.

3. The method for manufacturing a non-aqueous electrolyte secondary battery according to claim 1, wherein
the Li—Ni-based composite oxide is represented by a general formula $Li_aNi_xCo_yAl_zO_2$, wherein $0<a\leq1.2$, $0.8\leq x<1$, $0<y<0.1$, $0<z<0.1$, and $x+y+z=1$.

4. A method for voltage inspection for a non-aqueous electrolyte secondary battery, the method comprising:
carrying out, in initial charging and discharging for the non-aqueous electrolyte secondary battery, charging so that a positive electrode potential in terms of a lithium reference in an open circuit state after charging becomes 4.1 to 4.25 V, the state of charge of the battery is between 75 and 95% and an amount of volume expansion of a positive electrode active material and a negative electrode active material is 100%; and
subsequently measuring a voltage of the non-aqueous electrolyte secondary battery;
the non-aqueous electrolyte secondary battery comprising:
a negative electrode including the negative electrode active material;
a positive electrode including, as the positive electrode active material, a Li—Ni-based composite oxide represented by a general formula $Li_aNi_xM_{(1-x)}O_2$, wherein $0<a\leq1.2$, $0.6\leq x<1$, and M is at least one element selected from the group consisting of Co, Mn, and Al; and
a non-aqueous electrolyte.

* * * * *